(12) United States Patent
Sugawara et al.

(10) Patent No.: US 11,923,479 B2
(45) Date of Patent: Mar. 5, 2024

(54) LIGHT-EMITTING ELEMENT AND ELECTRONIC APPARATUS

(71) Applicant: SONY SEMICONDUCTOR SOLUTIONS CORPORATION, Kanagawa (JP)

(72) Inventors: Nobuhiro Sugawara, Kumamoto (JP); Yasunari Hanzawa, Kumamoto (JP); Shinsuke Nozawa, Kumamoto (JP); Masaki Shiozaki, Kumamoto (JP); Takeshi Satou, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 494 days.

(21) Appl. No.: 17/266,777

(22) PCT Filed: Aug. 7, 2019

(86) PCT No.: PCT/JP2019/031036
§ 371 (c)(1),
(2) Date: Feb. 8, 2021

(87) PCT Pub. No.: WO2020/044991
PCT Pub. Date: Mar. 5, 2020

(65) Prior Publication Data
US 2021/0320226 A1    Oct. 14, 2021

(30) Foreign Application Priority Data

Aug. 28, 2018   (JP) ................................ 2018-159251

(51) Int. Cl.
*H01L 23/00*   (2006.01)
*H01L 33/38*   (2010.01)
*H01L 33/62*   (2010.01)

(52) U.S. Cl.
CPC .......... *H01L 33/382* (2013.01); *H01L 33/387* (2013.01); *H01L 33/62* (2013.01)

(58) Field of Classification Search
CPC ...... H01L 33/382; H01L 33/387; H01L 33/62
See application file for complete search history.

(56) References Cited

U.S. PATENT DOCUMENTS

2010/0032694 A1   2/2010   Kim et al.
2012/0033409 A1   2/2012   Jeong et al.
(Continued)

FOREIGN PATENT DOCUMENTS

JP   2003-347589   12/2003
JP   2005-276899   10/2005
(Continued)

OTHER PUBLICATIONS

International Search Report prepared by the Japan Patent Office dated Oct. 7, 2019, for International Application No. PCT/JP2019/031036.

*Primary Examiner* — Anthony Ho
(74) *Attorney, Agent, or Firm* — SHERIDAN ROSS P.C.

(57) ABSTRACT

A light-emitting element and an electronic apparatus capable of reducing the element area and realizing a stable electrical connection. A light-emitting element according to the present technology includes a first semiconductor layer, a light-emitting layer, and a second semiconductor layer laminated in this order, and a light-emitting surface, a non-light-emitting surface, and a side surface connecting the light-emitting surface and the non-light-emitting surface. The side surface is inclined. A first electrode is in a concave portion in the light-emitting surface at a periphery of the first semiconductor layer. A second electrode is on a non-light-emitting surface side of the laminate. A third electrode is on the non-light-emitting surface side of the laminate and is (Continued)

insulated from the second electrode. The side wiring electrically connects the first electrode and the third electrode via the side surface.

11 Claims, 9 Drawing Sheets

(56) References Cited

U.S. PATENT DOCUMENTS

| | | |
|---|---|---|
| 2013/0181249 A1 | 7/2013 | Aoyagi et al. |
| 2017/0200861 A1 | 7/2017 | Pfeuffer et al. |

FOREIGN PATENT DOCUMENTS

| | | |
|---|---|---|
| JP | 2009-522803 | 6/2009 |
| JP | 2012-089846 | 5/2012 |
| JP | 2012-169435 | 9/2012 |
| JP | 2013-157496 | 8/2013 |
| JP | 2013-251496 | 12/2013 |

LIGHT-EMITTING ELEMENT AND ELECTRONIC APPARATUS

CROSS REFERENCE TO RELATED APPLICATIONS

This application is a national stage application under 35 U.S.C. 371 and claims the benefit of PCT Application No. PCT/JP2019/031036 having an international filing date of 7 Aug. 2019, which designated the United States, which PCT application claimed the benefit of Japanese Patent Application No. 2018-159251, filed 28 Aug. 2018, the entire disclosures of each of which are incorporated herein by reference.

TECHNICAL FIELD

The present technology relates to a light-emitting element and an electronic apparatus having one side electrode structure.

BACKGROUND ART

In a light-emitting element such as a micro-LED (light-emitting diode), one side electrode structure in which a p-type electrode and an n-type electrode are formed on one side of an element is often used. With the one side electrode structure, flip-chip mounting or the like can be used and mounting becomes easy.

In general, since a p-type semiconductor layer and an n-type semiconductor layer have a positional relationship of front and rear surfaces of the light-emitting element, in order to place the p-type electrode and the n-type electrode on the one side, it is necessary to electrically connect one electrode to the other surface.

For example, Patent Literature 1 discloses a light-emitting element in which an n-type cladding layer and a p-type cladding layer are laminated across a light-emitting layer, i.e., an element surface at an n-type cladding layer side and the p-type cladding layer are electrically connected by wiring provided on a side surface of the light-emitting element. The n-type electrode and the p-type electrode are provided on the element surface at the n-type cladding layer side, to thereby realizing the one side electrode structure.

CITATION LIST

Patent Literature

Patent Literature 1: Japanese Patent Application Laid-open No. 2013-157496

DISCLOSURE OF INVENTION

Technical Problem

However, in the structure as described in Patent Literature 1, there are problems that reducing an element area is limited, a connection area of side wiring toward the p-type cladding layer is limited, and an electrical connection is not stabilized.

In view of the above circumstances, an object of the present technology is to provide a light-emitting element and an electronic apparatus capable of reducing the element area and realizing a stable electrical connection.

Solution to Problem

In order to achieve the above object, a light-emitting element according to the present technology includes a laminate, a first electrode, a second electrode, a third electrode, and side wiring.

The laminate in which a first semiconductor layer having a first semiconductor type, a light-emitting layer, and a second semiconductor layer having a second semiconductor type are laminated in this order includes a light-emitting surface at a surface opposite to the light-emitting layer of the first semiconductor layer from which light generated in the light-emitting layer is emitted, a non-light-emitting surface at a surface opposite to the light-emitting layer of the second semiconductor layer, and a side surface connecting between the light-emitting surface and the non-light-emitting surface, and the side surface is inclined so that a distance between the side surfaces from a direction perpendicular to a layer surface direction of the laminate extends toward the light-emitting surface.

The first electrode is electrically connected to the first semiconductor layer, is arranged in a concave portion provided in the light-emitting surface at a periphery of the first semiconductor layer, and has a portion located closer to a light-emitting layer side than the light-emitting surface.

The second electrode is provided on a non-light-emitting surface side of the laminate and is electrically connected to the second semiconductor.

The third electrode is provided on the non-light-emitting surface side of the laminate and is insulated from the second electrode.

The side wiring electrically connects the first electrode and the third electrode via the side surface.

According to this configuration, by inclining the side surface of the laminate as described above, it is possible to bring the first electrode to a central portion of the light-emitting element, and to reduce the element area of the light-emitting element (chip shrink). Furthermore, the contact area of the first electrode and the first semiconductor layer is increased, it is possible to stabilize the electrical connection between the first electrode and the first semiconductor layer.

A depth of the concave portion from the light-emitting surface may be greater than a thickness of the first semiconductor layer between the first electrode and the light-emitting layer.

An entire of [0 0 0 1] the first electrode may be located closer to the light-emitting layer side than the light-emitting surface.

The first electrode may include a first portion located closer to the light-emitting layer side than the light-emitting surface, and a second portion provided on the light-emitting surface and covering the light-emitting surface.

The first semiconductor layer may have a high impurity region on the light-emitting surface side, and the second portion may be in contact with the high impurity region.

The light-emitting element may further include a transparent conductive layer formed of a transparent conductive material laminated on the light-emitting surface, and the second portion may be in contact with the transparent conductive layer.

The first electrode may be in contact with an end face of the light-emitting surface side of the side wiring.

The first electrode may be in contact with an inner surface that is a surface of a laminate side of the side wiring.

The first portion may be in contact with the inner surface that is a surface of the laminate side of the side wiring and the end face of the light-emitting surface side of the side wiring.

The light-emitting element may include a plurality of the first electrodes.

In order to achieve the above object, an electronic apparatus according to the present technology includes a light-emitting element. The light-emitting element includes a laminate in which a first semiconductor layer having a first semiconductor type, a light-emitting layer, and a second semiconductor layer having a second semiconductor type are laminated in this order including a light-emitting surface at a surface opposite to the light-emitting layer of the first semiconductor layer from which light generated in the light-emitting layer is emitted, a non-light-emitting surface at a surface opposite to the light-emitting layer of the second semiconductor layer, and a side surface connecting between the light-emitting surface and the non-light-emitting surface, the side surface being inclined so that a distance between the side surfaces from a direction perpendicular to a layer surface direction of the laminate extends toward the light-emitting surface; a first electrode electrically connected to the first semiconductor layer, arranged in a concave portion provided in the light-emitting surface at a periphery of the first semiconductor layer, and having a portion located closer to a light-emitting layer side than the light-emitting surface; a second electrode provided on a non-light-emitting surface side of the laminate and electrically connected to the second semiconductor; a third electrode provided on the non-light-emitting surface side of the laminate and insulated from the second electrode; and side wiring that electrically connects the first electrode and the third electrode via the side surface.

MODE(S) FOR CARRYING OUT THE INVENTION

A light-emitting element according to an embodiment of the present technology will be described.

[Structure of Light-Emitting Element]

Figure 1:
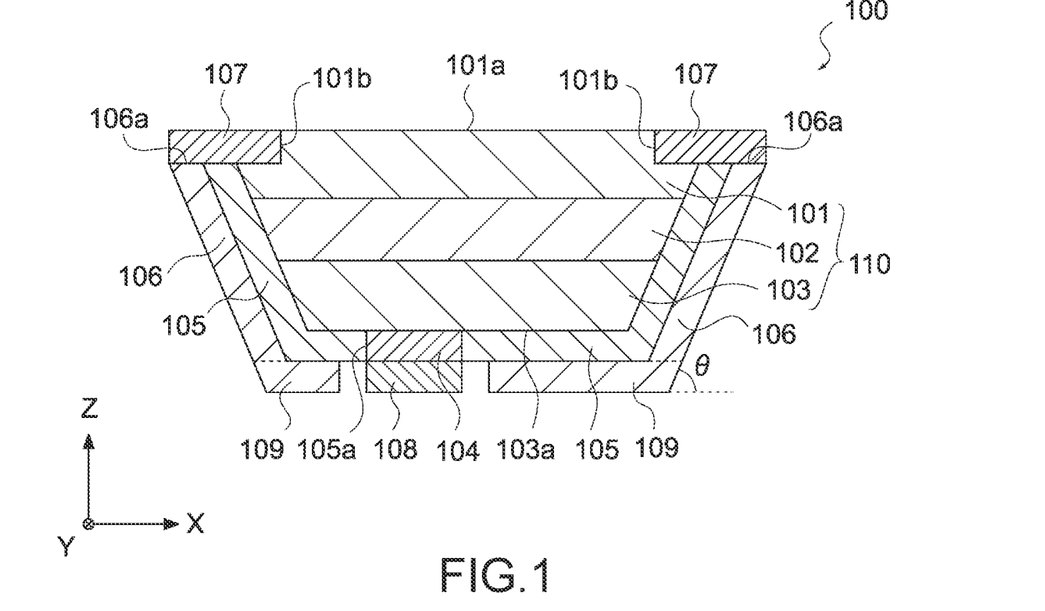
FIG. 1 is a cross-sectional diagram of a light-emitting element according to an embodiment of the present technology.
Figure 2:
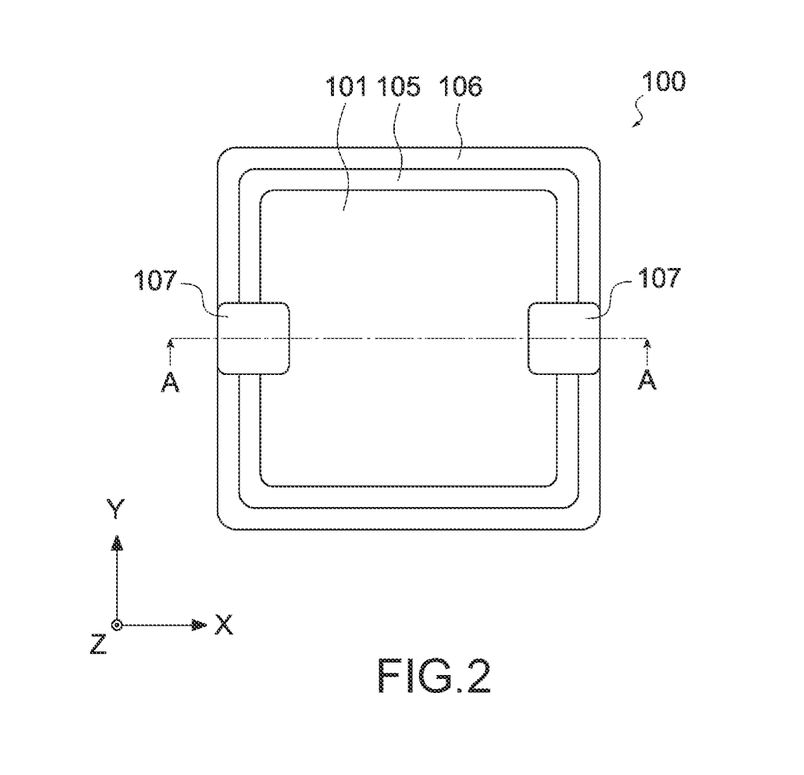
FIG. 2 is a plan diagram of the light-emitting element according to the embodiment of the present technology.

FIG. 1 is a cross-sectional diagram showing a structure of a light-emitting element 100 according to the embodiment of the present technology, and FIG. 2 is a plan diagram of the light-emitting element. FIG. 1 is a cross-sectional diagram taken along a line A-A of FIG. 2.

The light-emitting element 100 is an light-emitting diode, particularly suitably a micro-LED.

As shown in FIGS. 1 and 2, the light-emitting element 100 includes a first semiconductor layer 101, a light-emitting layer 102, a second semiconductor layer 103, a contact layer 104, an insulating layer 105, side wiring 106, first electrodes 107, a second electrode 108, and third electrodes 109.

The first semiconductor layer 101, the light-emitting layer 102, and the second semiconductor layer 103 are laminated in this order, and constitutes the laminate 110. Hereinafter, a laminating direction of the first semiconductor layer 101, the light-emitting layer 102, and the second semiconductor layer 103 is set as the X-Y direction, and the laminating direction is set as the Z direction.

The first semiconductor layer 101 is formed of a p-type semiconductor or an n-type semiconductor. The first semiconductor layer 101 is formed of the p-type semiconductor, e.g., p-type $(Al_{0.7}Ga_{0.3})_{0.5}In_{0.5}P$ having a carrier concentration of $1 \times 10^{17}$ to $1 \times 10^{18}$. Furthermore, the first semiconductor layer 101 is formed of the n-type semiconductor, e.g., n-type $(Al_{0.7}Ga_{0.3})_{0.5}In_{0.5}P$ of a carrier concentration $1 \times 10^{18}$.

The light-emitting layer 102 is a layer that emits light by recombination of electrons and holes. The light-emitting layer 102 may have, for example, a quantum well structure in which a plurality of quantum well layers including InGaP and barrier layers including $(Al_{0.6}Ga_{0.4})_{0.5}In_{0.5}P$ alternately laminated. Furthermore, the light-emitting layer 102 may be any structure that emits light due to other recombination in addition to this.

The second semiconductor layer 103 is formed of a semiconductor of the n-type semiconductor or p-type semiconductor which has a different semiconductor type from the first semiconductor layer 101. The second semiconductor layer 103 is formed of the n-type semiconductor, e.g., n-type $(Al_{0.7}Ga_{0.3})_{0.5}In_{0.5}P$ having a carrier concentration of $1 \times 10^{18}$. Furthermore, the second semiconductor layer 103 is formed of the p-type semiconductor, e.g., p-type $Al_{0.7}Ga_{0.3})_{0.5}In_{0.5}P$ having a carrier concentration of $1 \times 10^{17}$ to $1 \times 10^{18}$.

In the laminate 110, when a voltage is applied between the first semiconductor layer 101 and the second semiconductor layer 103, light emission occurs in the light-emitting layer 102. Light is emitted through the first semiconductor layer 101. Hereinafter, a surface of the first semiconductor layer 101 on an opposite side to the light-emitting layer 102 is referred to as a light-emitting surface 101a. In addition, a surface of the second semiconductor layer 103 on an opposite side to the light-emitting layer 102 is referred to as a non-light-emitting surface 103a.

Figure 3:
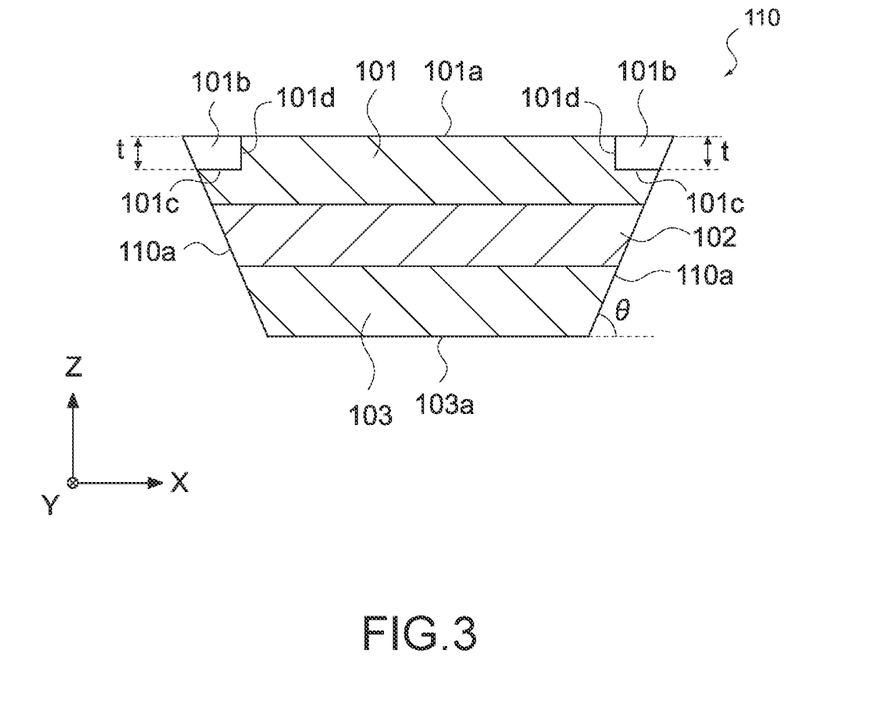
FIG. 3 is a cross-sectional diagram of a laminate included in the light-emitting element according to the embodiment of the present technology.

FIG. 3 is a cross-sectional diagram showing only the laminate 110. As shown in the same drawing, the laminate 110 has side surfaces 110a each connecting between the light-emitting surface 101a and the non-light-emitting surface 103a.

Each side surface 110a is inclined so that the distance between the side surfaces 110a extends toward the light-emitting surface 101a from a direction (Z direction) perpendicular to a layer surface direction (X-Y direction) of the laminate 110. That is, when an angle formed by the layer surface direction (X-Y direction) and each side surface 110a is θ, θ is less than 90°.

Furthermore, as shown in FIG. 3, concave portions 101b are provided on a periphery of the first semiconductor layer 101. Each concave portion 101b is formed by digging down to a predetermined depth from the light-emitting surface 101a, and a depth t of each concave portion 101b can be set between the light-emitting surface 101a and the light-emitting layer 102. Specifically, the depth t can be 300 nm or more and 400 nm or less.

As shown in FIG. 3, in an inner peripheral surface of each concave portion 101b, a surface parallel to the layer surface direction (X-Y direction) is defined as a bottom surface 101c, and a surface parallel to the laminating direction (Z direction) is defined as a side surface 101d.

As shown in FIG. 1, in each concave portion 101b, a first electrode 107 is provided. The number and an arrangement of the concave portions 101b can have various configurations as will be described later.

The contact layer 104 is provided between the second semiconductor layer 103 and the second electrode 108 to electrically connect the second semiconductor layer 103 and the second electrode 108. The contact layer 104 is formed of a conductive material, i.e., is formed of the n-type GaAs when the second semiconductor layer 103 is n-type semiconductor, and is formed of p-type GaAs, p-type GaP, p-type AlGaAs or the like when the second semiconductor layer 103 is the p-type semiconductor.

The insulating layer 105 covers and insulates the non-light-emitting surface 103a and the side surfaces 110a of the laminate 110. The insulating layer 105 is formed of a transparent protective material and can be formed of, for example, $SiO_2$, SiN, $Al_2O_3$, or the like. An opening 105a communicating with the non-light-emitting surface 103a is provided on the non-light-emitting surface 103a, and the contact layer 104 is provided in the opening 105a.

The side wiring 106 is arranged on the insulating layer 105 on each side surface 110a, and electrically connects each first electrode 107 and each third electrode 109 via each side surface 110a. As shown in FIG. 1, the side wiring 106 is connected to each first electrode 107 by contacting an end surface 106a on a light-emitting surface 101a side with each first electrode 107. In addition, the side wiring 106 also functions as a light reflector that reflects light emitted from the light-emitting layer 102 to the light-emitting surface 101a side.

The side wiring 106 is formed of a material having conductivity and light reflectivity, and may be formed of Au, for example. A thickness of the side wiring 106 can be, for example, 300 nm or more and 400 m or less. Incidentally, the side wiring 106 can be formed by sputtering. Since the side surfaces 110a are inclined as described above, the side wiring 106 can be easily formed from a non-light-emitting surface 103a side as compared with the case where the side surfaces 110a are not inclined.

Each first electrode 107 is electrically connected to the first semiconductor layer 101, and is electrically connected to the third electrode 109 via the side wiring 106. Each first electrode 107 is arranged in each concave portion 101b, and is located closer to the light-emitting layer 102 than each light-emitting surface 101a. In FIG. 1, although an entire of the first electrode 107 is located closer to a light-emitting layer 102 side than the light-emitting surface 101a, but as will be described later, a part of each first electrode 107 may be located closer to the light-emitting layer 102 side than the light-emitting surface 101a. The first electrode 107 may have a shape in contact with the bottom surface 101c and the side surface 101d of the concave portion 101b.

As shown in FIG. 2, the light-emitting element 100 may include two first electrodes 107. Furthermore, the light-emitting element 100 may include one first electrode 107, and may include three or more first electrodes 107.

The first electrode 107 is formed of a material having conductivity, i.e., may be formed of p-type GaAs, p-type GaP or p-type AlGaAs when the first semiconductor layer 101 is p-type, or may be formed of n-type GaAs when the first semiconductor layer 101 is n-type. A thickness of each first electrode 107 is suitably about the same as the depth of each concave portion 101b, and can be 300 nm or more and 400 nm or less.

The second electrode 108 is provided on the non-light-emitting surface 103a side of the laminate 110, and is electrically connected to the second semiconductor layer 103. The second electrode 108 may be formed on the contact layer 104, and may be electrically connected to the second semiconductor layer 103 via the contact layer 104. The second electrode 108 is formed of a conductive material, and may be formed of Au, for example.

Each third electrode 109 is provided on the non-light-emitting surface 103a side of the laminate 110, and is insulated from the second electrode 108. Each third electrode 109 may be spaced apart from the second electrode 108 on the insulating layer 105. Each third electrode 109 is electrically connected to the first electrode 107 via the side wiring 106, i.e., is electrically connected to the first semiconductor layer 101. Each third electrode 109 is formed of a conductive material, and may be formed of Au, for example.

The light-emitting element 100 has the above-described configuration. Each second electrode 108 and each third electrode 109 electrically connected to each first semiconductor layer 101 and each second semiconductor layer 103 are provided on the same surface on the non-light-emitting surface 103a side with respect to the laminate 110. Thus, one side electrode structure is realized.

[Effect of Light-Emitting Element]

Figure 4:
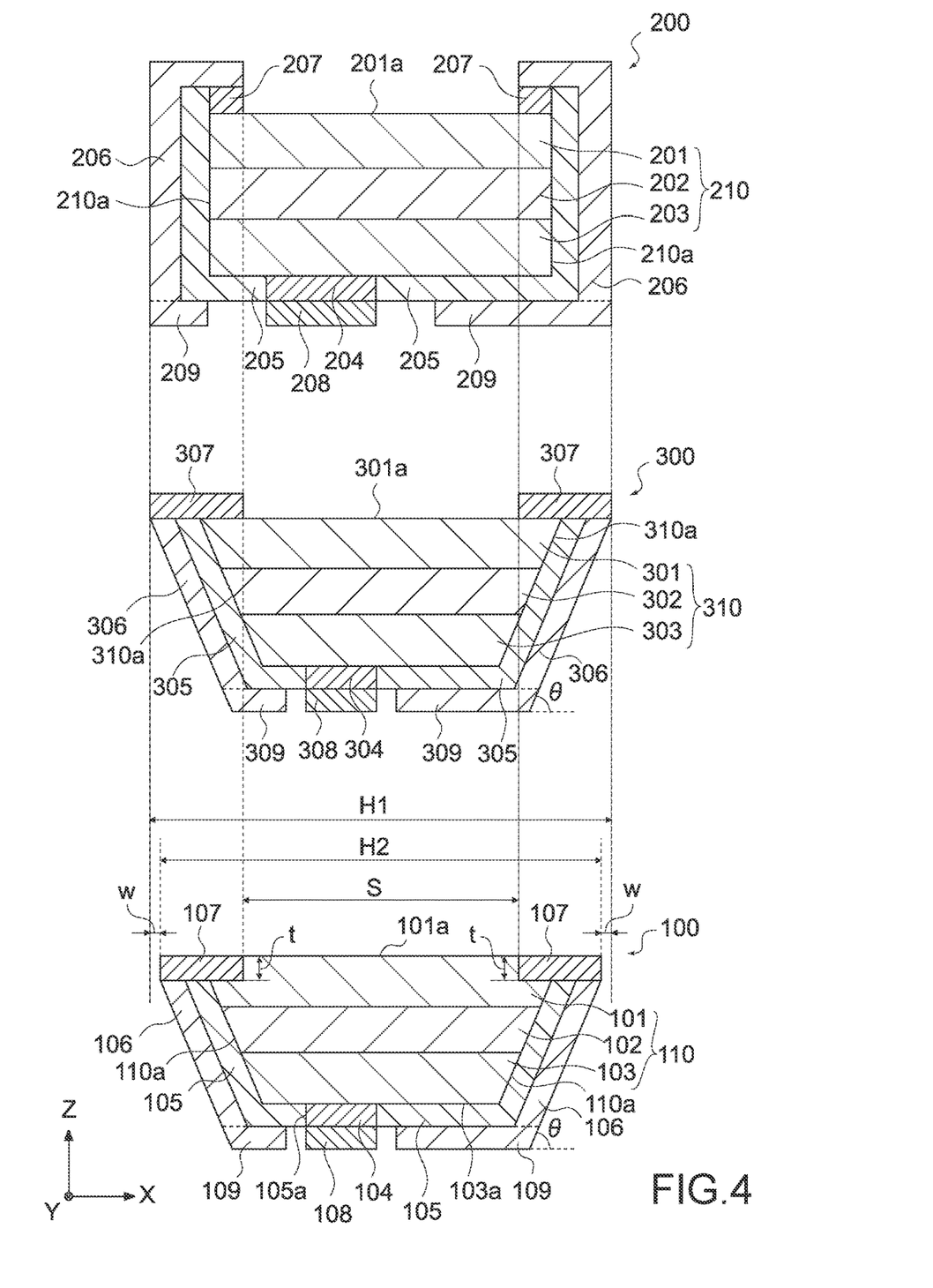
FIG. 4 is a schematic diagram showing an effect of the light-emitting element according to the embodiment of the present technology.

The effect of the light-emitting element 100 will be described. FIG. 4 is a diagram showing the effect of the light-emitting element 100, and is a diagram comparing the sizes of the light-emitting element 200 and the light-emitting element 300 according to Comparative Example and the light-emitting element 100 according to the present embodiment.

The light-emitting element 200 includes a first semiconductor layer 201, a light-emitting layer 202, a second semiconductor layer 203, a contact layer 204, an insulating layer 205, side wiring 206, first electrodes 207, a second electrode 208, and third electrodes 209. The first semiconductor layer 201, the light-emitting layer 202, and the second semiconductor layer 203 are laminated to configure a laminate 210.

In the structure of the light-emitting element 200, each side surface 210a of the laminate 210 is perpendicular to the layer surface direction. The manufacturing process of the light-emitting element 200 needs to form the side wiring 206 after each first electrode 207 is formed.

The light-emitting element 300 includes a first semiconductor layer 301, a light-emitting layer 302, a second semiconductor layer 303, a contact layer 304, an insulating layer 305, side wiring 306, first electrodes 307, a second electrode 308, and third electrodes 309. The first semiconductor layer 301, the light-emitting layer 302, and the second semiconductor layer 303 are laminated to configure a laminate 310.

The light-emitting element 300 has an element width H1 same as that of the light-emitting element 200, and has a structure in which each side surface 310a of the laminate 310 is inclined. In this structure, by inclining each side surface 310a, light generated in the light-emitting layer 302 is reflected toward each light-emitting surface 301a, so that light emission efficiency can be improved.

In addition, it is unnecessary to form the side wiring 306 over the first electrodes 307, and the number of manufacturing process can be reduced.

The light-emitting element 100 can further reduce the element width with respect to the configuration of the light-emitting element 300.

As shown in FIG. 4, in the light-emitting element 100, each first electrode 107 is arranged so as to move toward the light-emitting layer 102 side from the light-emitting surface 101a with respect to the light-emitting element 300. A moving distance of the first electrode 107 from the light-emitting layer 102 is equal to the depth t of the concave portion 101b.

By moving each first electrode 107 toward the light-emitting layer 102 side, each first electrode 107 can be moved toward a central portion of the light-emitting element 100 along an incline of each side surface 110a while maintaining an area of the light-emitting surface 101a (width S in the drawing). Specifically, as shown in FIG. 4, when a narrowed width w of the light-emitting element 100 with respect to the light-emitting element 300 is represented by t/tan θ. As a result, the width of the light-emitting element 100 is reduced from the width H1 to a width H2.

In this way, in the light-emitting element 100, it is possible to reduce the element width (chip shrink). Furthermore, by inclining each side surface 110a, an improvement in light extraction efficiency is also realized.

[Arrangement of First Electrode]

Figure 5:
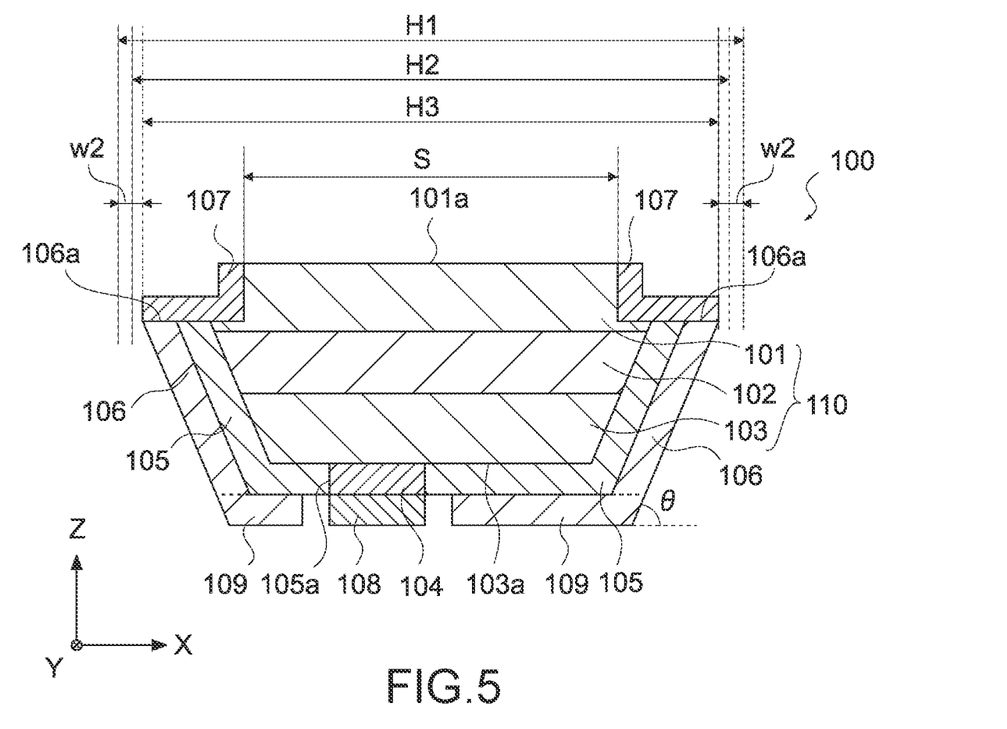
FIG. 5 is a cross-sectional diagram of the light-emitting element according to the embodiment of the present technology.

Each first electrode 107 may be arranged closer to the light-emitting layer 102. FIG. 5 is a cross-sectional diagram of the light-emitting element 100 in which each first electrode 107 is closer to the light-emitting layer 102, and FIG. 6 is a cross-sectional diagram of the laminate 110 in this case.

Figure 6:
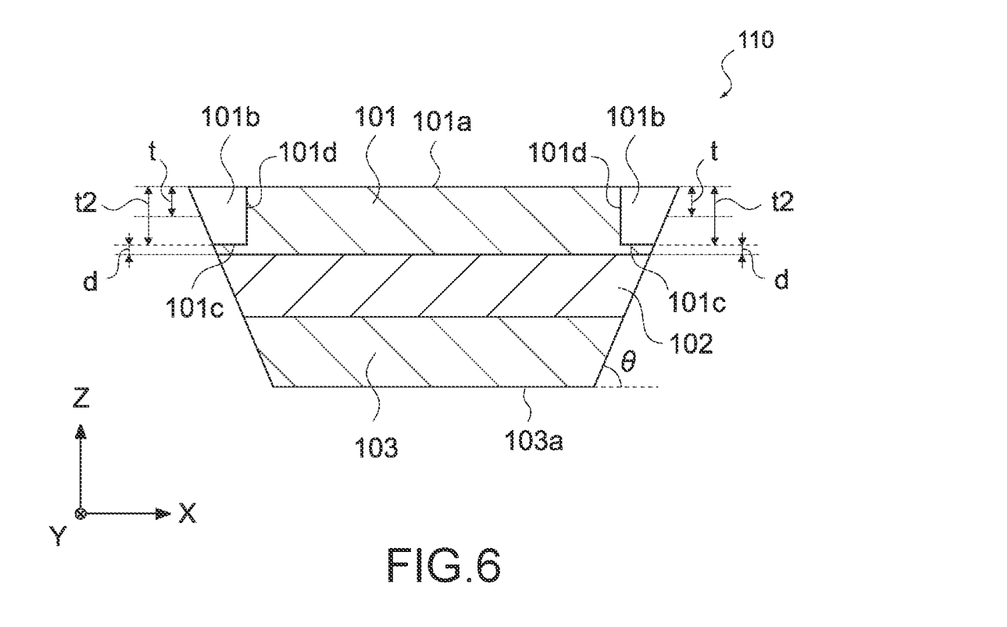
FIG. 6 is a cross-sectional diagram of the laminate included in the light-emitting element according to an embodiment of the present technology.

As shown in FIG. 6, each concave portion 101b has a depth t2 that is further deeper than the depth t. If the thickness d of the first semiconductor layer 101 between each first electrode 107 (see FIG. 5) and the light-emitting layer 102, the depth t2 may be larger than the thickness d. Specifically, the depth t2 can be, for example, 1100 nm or more and 1300 nm.

Note that the depth t2 is set to a depth that does not reach the light-emitting layer 102. This is because, if the concave portion 101b reaches the light-emitting layer 102, the volume of the light-emitting layer 102 decreases and the light-emitting efficiency is lowered. In addition, the light-emitting layer 102 may be damaged when each concave portion 101b is formed.

In this configuration, by bringing each first electrode 107 closer to the light-emitting layer 102, the first electrode 107 is further closer to the element center portion, and it is possible to reduce the element area. Specifically, when a narrowed width w2 with respect to the width H1 of the light-emitting element 300 according to Comparative Example, the width w2 is represented by t2/tan θ. As a result, the width of the light-emitting element 100 is reduced from the width H1 to a width H3.

Furthermore, by bringing the first electrode 107 closer to the light-emitting layer 102, the area of each side surface 101d of each concave portion 101b increases, and the contact area between the first electrode 107 and the first semiconductor layer 101 increases, so that a contact resistance between each first electrode 107 and the first semiconductor layer 101 can be reduced.

Figure 7:
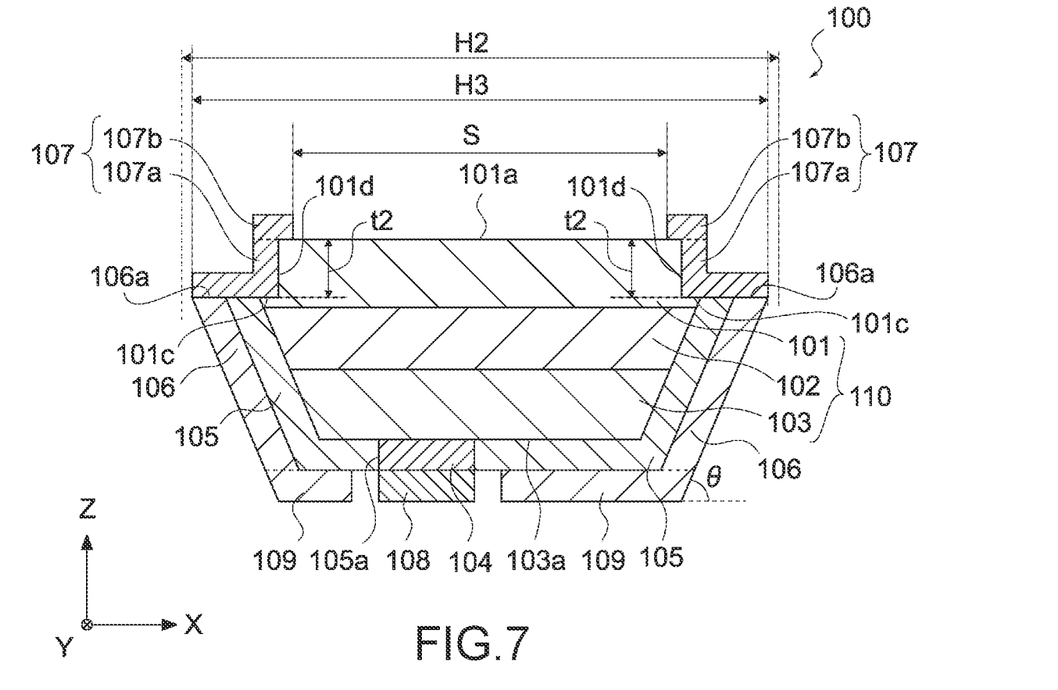
FIG. 7 is a cross-sectional diagram of the light-emitting element according to the embodiment of the present technology.

In addition, each first electrode 107 may be arranged from inside of each concave portion 101b over the light-emitting surface 101a. FIG. 7 is a cross-sectional diagram showing each first electrode 107 formed over the light-emitting surface 101a.

As shown in the same drawing, each first electrode 107 has a first portion 107a and a second portion 107b. The first portion 107a is arranged in each concave portion 101b and is located closer to the light-emitting layer 102 than the light-emitting surface 101a.

Each second portion 107b is a portion extending from each first portion 107a onto the light-emitting surface 101a and covering the light-emitting surface 101a. Each second portion 107b is provided on a periphery of the light-emitting surface 101a so as not to shield the light-emitting surface 101a.

By forming each second portion 107b on the light-emitting surface 101a, the contact area between the first electrode 107 and the first semiconductor layer 101 is further improved, so that the contact resistance between each first electrode 107 and the first semiconductor layer 101 can be further reduced.

In addition, by reducing the width of the bottom surface 101c, it is possible to suppress a shielding area of the light-emitting surface 101a by each first electrode 107 and to maintain an area of the light-emitting surface 101a (width S in the drawing).

Figure 8:
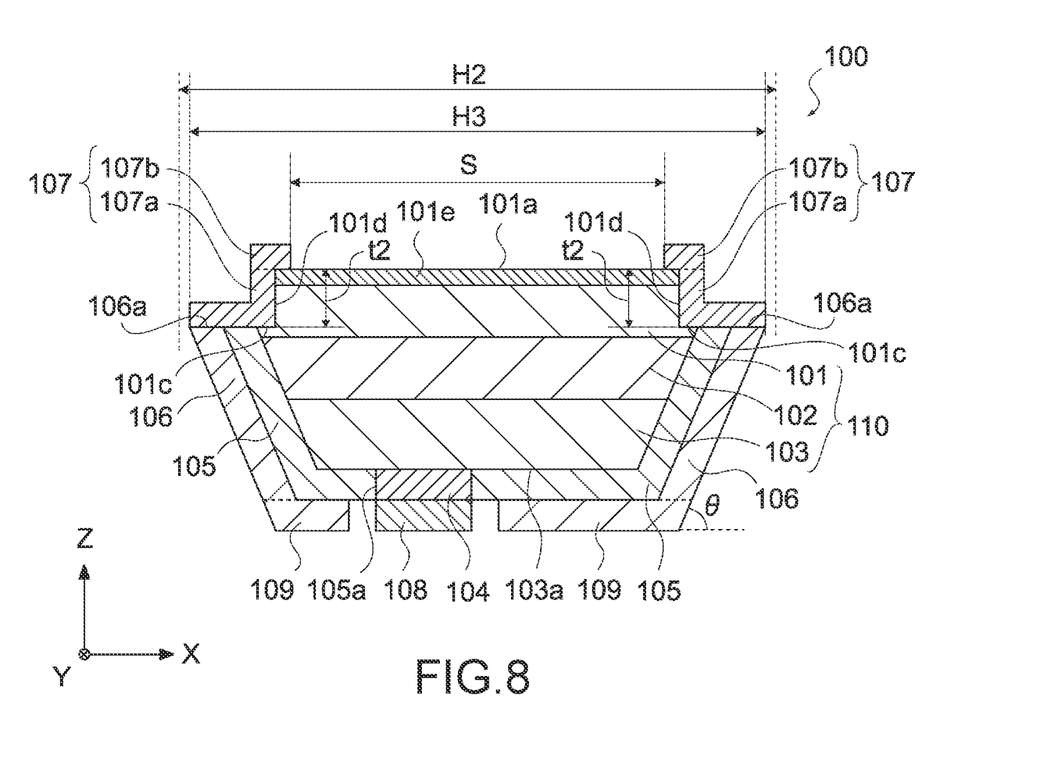
FIG. 8 is a cross-sectional diagram of the light-emitting element according to the embodiment of the present technology.

Furthermore, in a case where each first electrode 107 is formed on the light-emitting surface 101a, a high impurity region may be formed on the surface of the first semiconductor layer 101. FIG. 8 is a cross-sectional diagram of the light-emitting element 100 in which a high impurity region 101e is formed on the surface of the first semiconductor layer 101.

The high impurity region 101e is a region heavily doped with impurities. When the first semiconductor layer 101 is formed of the p-type semiconductor, it may be a region heavily doped with p-type dopants such as Zn and C. Furthermore, when the first semiconductor layer 101 is formed of the n-type semiconductor, it may be a region heavily doped with n-type dopants such as Si.

By providing the high impurity region 101e on the surface of the first semiconductor layer 101, a contact voltage between each first electrode 107 and the first semiconductor layer 101 can be stabilized and reduced.

Figure 9:
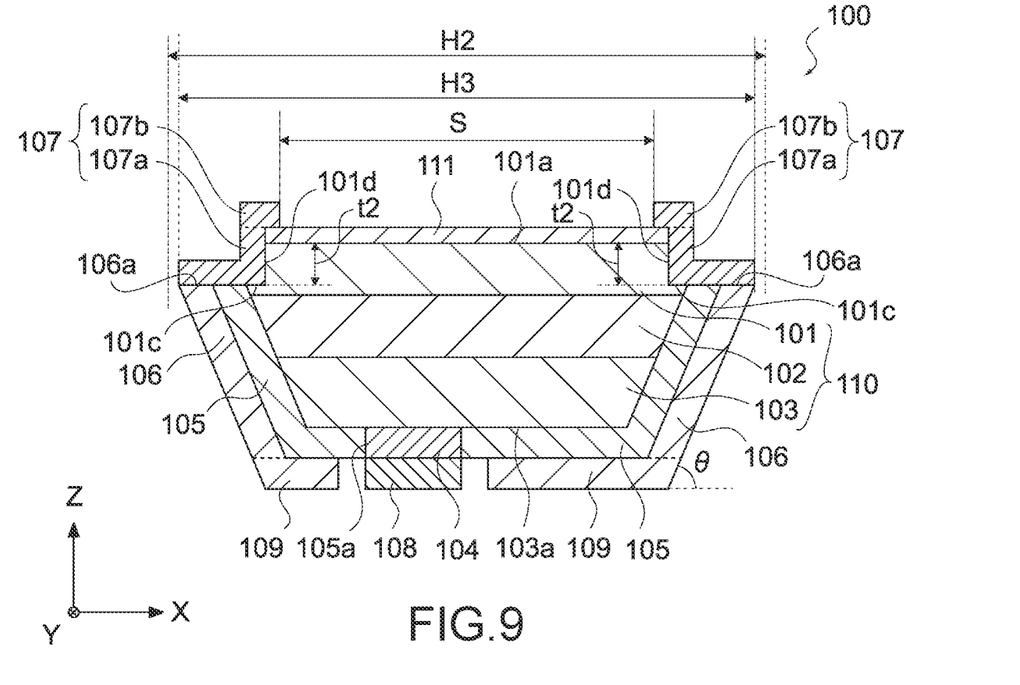
FIG. 9 is a cross-sectional diagram of the light-emitting element according to the embodiment of the present technology.

Incidentally, instead of the high impurity region 101e, a transparent conductive layer may be laminated on the first semiconductor layer 101. FIG. 9 is a cross-sectional diagram of the light-emitting element 100 including the transparent conductive layer 111. The transparent conductive layer 111 may be formed of a light-transmissive conductive dielectric material such as ITO (Indium Tin Oxide).

By contacting each second portion 107b of each first electrode 107 with the transparent conductive layer 111, the contact voltage between each first electrode 107 and the first semiconductor layer 101 can be stabilized and reduced.

[Connection of First Electrode and Side Wiring]

In the above description, although each first electrode 107 is in contact with the end surface 106a of the side wiring 106 (see FIG. 1), each first electrode 107 may be in contact with a portion other than the end surface 106a of the side wiring 106.

Figure 10:
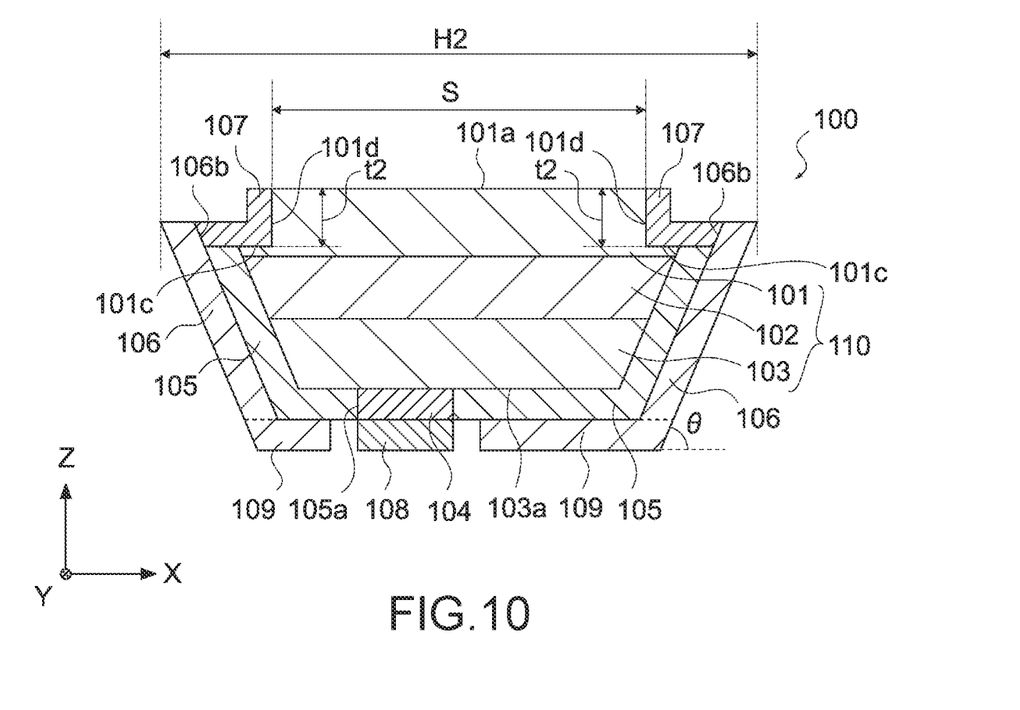
FIG. 10 is a cross-sectional diagram of the light-emitting element according to the embodiment of the present technology.

FIG. 10 is a schematic diagram showing a configuration in which each first electrode 107 is in contact with each inner surface 106b of the side wiring 106. Each inner surface 106b is a surface of the side wiring 106 on a laminate 110 side. As shown in the same drawing, the side wiring 106 can be extended to the light-emitting surface 101a side from the first electrode 107, and an end surface of each first electrode 107 can be brought into contact with the inner surface 106b (film surface).

In the configuration in which each first electrode 107 contacts the end surface 106a, when the thickness of the side wiring 106 is reduced, the contact area between each first electrode 107 and the side wiring 106 decreases. On the other hand, in the configuration in which each first electrode 107 contacts each inner surface 106b, even if the thickness of the side wiring 106 is reduced, the contact area between each first electrode 107 and the side wiring 106 does not decrease.

Therefore, it is possible to reduce the side wiring 106 while maintaining stability of the electrical connection between each first electrode 107 and the side wiring 106, and to correspondingly reduce the element area.

Figure 11:
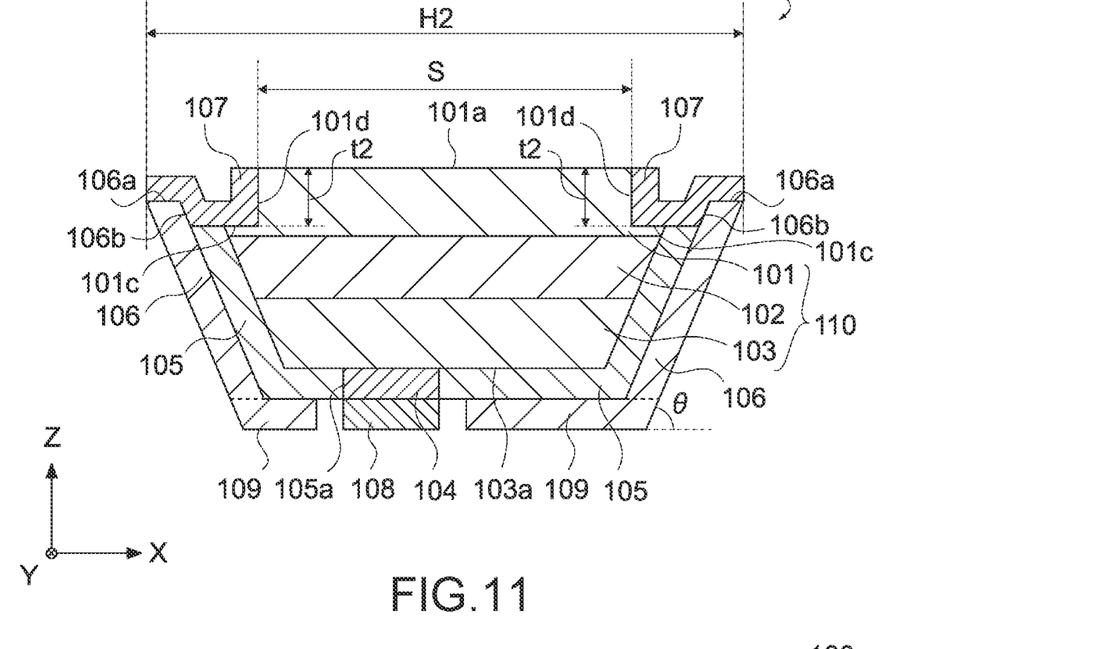
FIG. 11 is a cross-sectional diagram of the light-emitting element according to the embodiment of the present technology.

Furthermore, each first electrode 107 may be in contact with both each inner surface 106b and each end surface 106a of the side wiring 106. FIG. 11 is a schematic diagram showing a configuration in which each first electrode 107 contacts each inner surface 106b and each end surface 106a of the side wiring 106.

In this configuration, it is possible to stabilize the electrical connection between each the first electrode 107 and the side wiring 106, and to further reduce the contact resistance.

Figure 12:
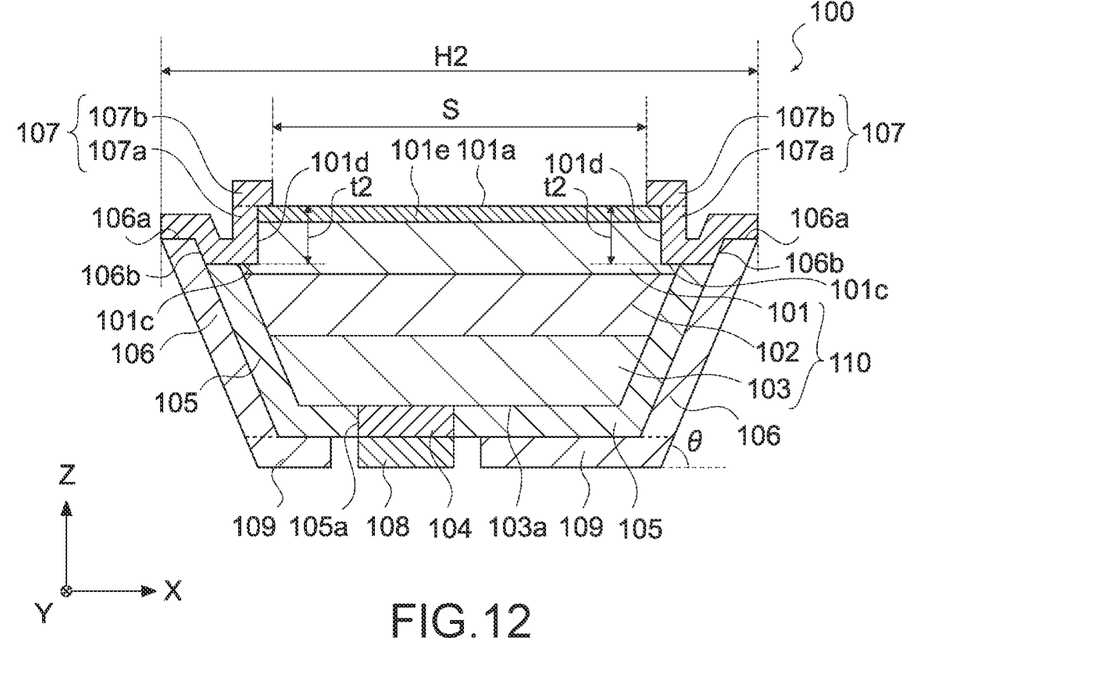
FIG. 12 is a cross-sectional diagram of the light-emitting element according to the embodiment of the present technology.

Incidentally, in this configuration, each first electrode 107 may have each second portion 107b that covers the light-emitting surface 101a. FIG. 12 is a schematic diagram showing a configuration in which each first electrode 107 contacts each inner surface 106b and each end surface 106a, and covers the light-emitting surface 101a.

The light-emitting surface 101a is provided with the high impurity region 101e. In this configuration, the contact resistance between the high impurity region 101e and each first electrode 107 can be reduced, and the contact resistance between each first electrode 107 and the side wiring 106 can be reduced.

Note that a transparent conductive layer 111 may be laminated on the light-emitting surface 101a instead of the high impurity region 101e, and the high impurity region 101e and the transparent conductive layer 111 may not be provided.

[Planar Arrangement of First Electrode]

Figure 13:
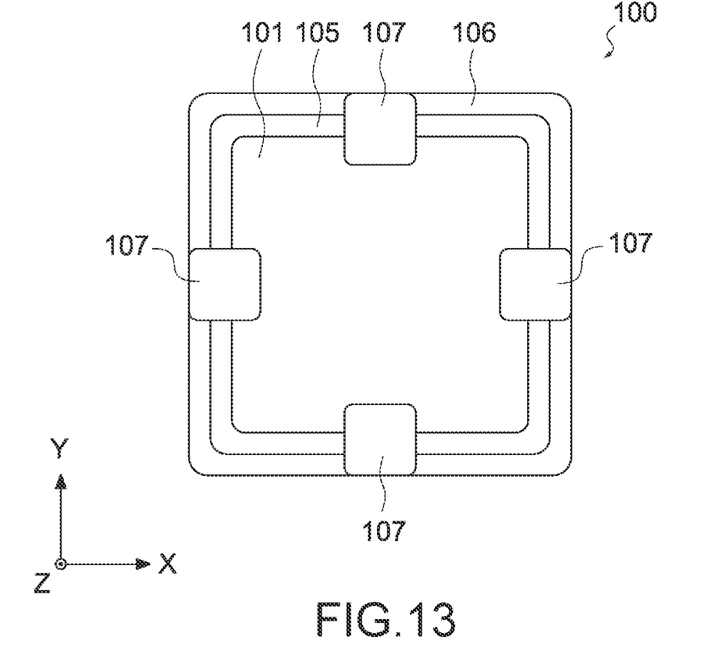
FIG. 13 is a plan diagram of the light-emitting element according to the embodiment of the present technology.
Figure 14:
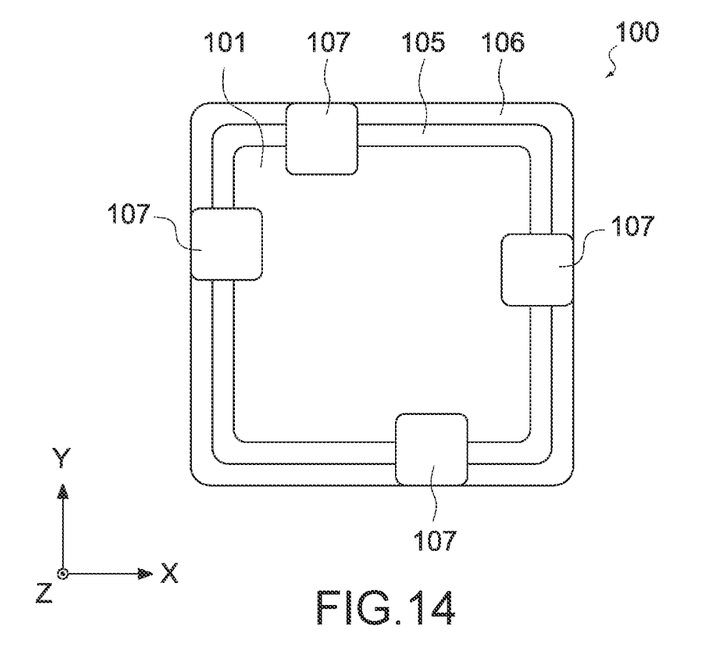
FIG. 14 is a plan diagram of the light-emitting element according to the embodiment of the present technology.
Figure 15:
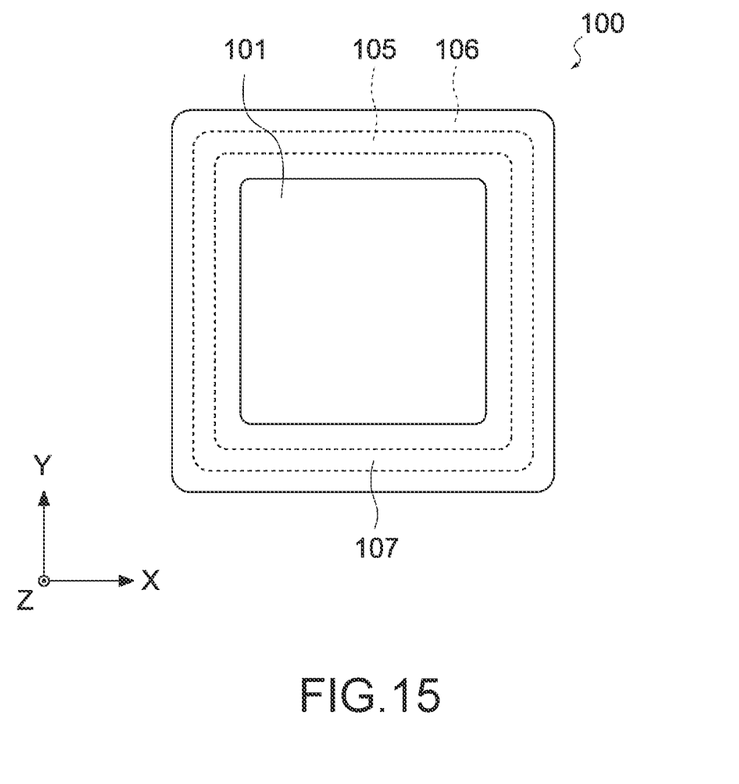
FIG. 15 is a plan diagram of the light-emitting element according to the embodiment of the present technology.

Planar arrangement of the first electrode 107 is not limited to that shown in FIG. 2. FIGS. 13 to 15 are schematic diagrams showing an arrangement example of the first electrode 107. As shown in FIGS. 13 and 14, the first electrodes 107 may be provided on four sides of the light-emitting element 100. Furthermore, as shown in FIG. 15, the light-emitting element 100 may be provided so as to surround the periphery thereof.

Each of the first electrodes 107 may have any of the structures described above. It is possible to reduce the element width in all of the four sides by providing the first electrode 107 on all four sides. Incidentally, the planar shape of the light-emitting element 100 is not limited to a rectangle, and may be polygonal or circular.

[Electronic Apparatus]

The light-emitting element 100 can be used as a light-emitting element mounted on a pixel of a display, an illumination light source, and various other electronic apparatuses. As described above, the light-emitting element 100 can be reduced in the element area while maintaining the area of the light-emitting surface 101a, and can be mounted at high density. Furthermore, stable electrical connection is realized, it is also possible to reduce the power consumption.

The present technology may also have the following structures.

(1)

A light-emitting element, including:
 a laminate in which a first semiconductor layer having a first semiconductor type, a light-emitting layer, and a second semiconductor layer having a second semiconductor type are laminated in this order including a light-emitting surface at a surface opposite to the light-emitting layer of the first semiconductor layer from which light generated in the light-emitting layer is emitted, a non-light-emitting surface at a surface opposite to the light-emitting layer of the second semiconductor layer, and a side surface connecting between the light-emitting surface and the non-light-emitting surface, the side surface being inclined so that a distance between the side surfaces from a direction perpendicular to a layer surface direction of the laminate extends toward the light-emitting surface;
 a first electrode electrically connected to the first semiconductor layer, arranged in a concave portion provided in the light-emitting surface at a periphery of the first semiconductor layer, and having a portion located closer to a light-emitting layer side than the light-emitting surface;
 a second electrode provided on a non-light-emitting surface side of the laminate and electrically connected to the second semiconductor;
 a third electrode provided on the non-light-emitting surface side of the laminate and insulated from the second electrode; and
 side wiring that electrically connects the first electrode and the third electrode via the side surface.

(2)

The light-emitting element according to (1), in which
 a depth of the concave portion from the light-emitting surface is greater than a thickness of the first semiconductor layer between the first electrode and the light-emitting layer.

(3)

The light-emitting element according to (1) or (2), in which
 an entire of the first electrode is located closer to the light-emitting layer side than the light-emitting surface.

(4)

The light-emitting element according to (1) or (2), in which the first electrode includes a first portion located closer to the light-emitting layer side than the light-emitting surface, and a second portion provided on the light-emitting surface and covering the light-emitting surface.

(5)

The light-emitting element according to (4), in which the first semiconductor layer has a high impurity region on the light-emitting surface side, and the second portion may be in contact with the high impurity region.

(6)

The light-emitting element according to (4), further including:

a transparent conductive layer formed of a transparent conductive material laminated on the light-emitting surface, and the second portion may be in contact with the transparent conductive layer.

(7)

The light-emitting element according to any one of (1) to (4), in which the first electrode is in contact with an end face of the light-emitting surface side of the side wiring.

(8)

The light-emitting element according to any one of (1) to (7), in which the first electrode is in contact with an inner surface that is a surface of a laminate side of the side wiring.

(9)

The light-emitting element according to any one of (4) to (6), in which the first portion is in contact with the inner surface that is a surface of the laminate side of the side wiring and the end face of the light-emitting surface side of the side wiring.

(10)

The light-emitting element according to any one of (1) to (9), including:

a plurality of the first electrodes.

(11)

An electronic apparatus, including:

a light-emitting element including a light-emitting element, including:

a laminate in which a first semiconductor layer having a first semiconductor type, a light-emitting layer, and a second semiconductor layer having a second semiconductor type are laminated in this order including a light-emitting surface at a surface opposite to the light-emitting layer of the first semiconductor layer from which light generated in the light-emitting layer is emitted, a non-light-emitting surface at a surface opposite to the light-emitting layer of the second semiconductor layer, and a side surface connecting between the light-emitting surface and the non-light-emitting surface, the side surface being inclined so that a distance between the side surfaces from a direction perpendicular to a layer surface direction of the laminate extends toward the light-emitting surface;

a first electrode electrically connected to the first semiconductor layer, arranged in a concave portion provided in the light-emitting surface at a periphery of the first semiconductor layer, and having a portion located closer to a light-emitting layer side than the light-emitting surface;

a second electrode provided on a non-light-emitting surface side of the laminate and electrically connected to the second semiconductor;

a third electrode provided on the non-light-emitting surface side of the laminate and insulated from the second electrode; and side wiring that electrically connects the first electrode and the third electrode via the side surface.

REFERENCE SIGNS LIST 100 light-emitting element
101 first semiconductor layer
101a light-emitting surface
101b concave portion
101e high impurity region
102 light-emitting layer
103 second semiconductor layer
103a non-light-emitting surface
106 side wiring
106a end surface
106b inner surface
107 first electrode
107a first portion
107b second portion
108 second electrode
109 third electrode
110 laminate
110a side surface
111 transparent conductive layer

What is claimed is:

1. A light-emitting element, comprising:

a laminate in which a first semiconductor layer having a first semiconductor type, a light-emitting layer, and a second semiconductor layer having a second semiconductor type are laminated in this order including a light-emitting surface at a surface opposite to the light-emitting layer of the first semiconductor layer from which light generated in the light-emitting layer is emitted, a non-light-emitting surface at a surface opposite to the light-emitting layer of the second semiconductor layer, and a side surface connecting between the light-emitting surface and the non-light-emitting surface, the side surface being inclined so that a distance between the side surfaces from a direction perpendicular to a layer surface direction of the laminate extends toward the light-emitting surface;

a first electrode electrically connected to the first semiconductor layer, arranged in a concave portion provided in the light-emitting surface at a periphery of the first semiconductor layer, and having a portion located closer to a light-emitting layer side than the light-emitting surface;

a second electrode provided on a non-light-emitting surface side of the laminate and electrically connected to the second semiconductor;

a third electrode provided on the non-light-emitting surface side of the laminate and insulated from the second electrode; and side wiring that electrically connects the first electrode and the third electrode via the side surface.

2. The light-emitting element according to claim 1, wherein a depth of the concave portion from the light-emitting surface is greater than a thickness of the first semiconductor layer between the first electrode and the light-emitting layer.

3. The light-emitting element according to claim 1, wherein an entirety of the first electrode is located closer to the light-emitting layer side than the light-emitting surface.

4. The light-emitting element according to claim 1, wherein the first electrode includes a first portion located closer to the light-emitting layer side than the light-emitting surface, and a second portion provided on the light-emitting surface and covering the light-emitting surface.

5. The light-emitting element according to claim 4, wherein
the first semiconductor layer has a high impurity region on the light-emitting surface side, and the second portion may be in contact with the high impurity region.

6. The light-emitting element according to claim 4, further comprising:
a transparent conductive layer formed of a transparent conductive material laminated on the light-emitting surface, and the second portion may be in contact with the transparent conductive layer.

7. The light-emitting element according to claim 1, wherein
the first electrode is in contact with an end face of the light-emitting surface side of the side wiring.

8. The light-emitting element according to claim 1, wherein
the first electrode is in contact with an inner surface that is a surface of a laminate side of the side wiring.

9. The light-emitting element according to claim 4, wherein
the first portion is in contact with the inner surface that is a surface of a laminate side of the side wiring and the end face of the light-emitting surface side of the side wiring.

10. The light-emitting element according to claim 1, comprising:
a plurality of the first electrodes.

11. An electronic apparatus, comprising:
a light-emitting element, including:
a laminate in which a first semiconductor layer having a first semiconductor type, a light-emitting layer, and a second semiconductor layer having a second semiconductor type are laminated in this order including a light-emitting surface at a surface opposite to the light-emitting layer of the first semiconductor layer from which light generated in the light-emitting layer is emitted, a non-light-emitting surface at a surface opposite to the light-emitting layer of the second semiconductor layer, and a side surface connecting between the light-emitting surface and the non-light-emitting surface, the side surface being inclined so that a distance between the side surfaces from a direction perpendicular to a layer surface direction of the laminate extends toward the light-emitting surface;
a first electrode electrically connected to the first semiconductor layer, arranged in a concave portion provided in the light-emitting surface at a periphery of the first semiconductor layer, and having a portion located closer to a light-emitting layer side than the light-emitting surface;
a second electrode provided on a non-light-emitting surface side of the laminate and electrically connected to the second semiconductor;
a third electrode provided on the non-light-emitting surface side of the laminate and insulated from the second electrode; and
side wiring that electrically connects the first electrode and the third electrode via the side surface.

\* \* \* \* \*